(12) United States Patent
Li et al.

(10) Patent No.: US 11,552,224 B2
(45) Date of Patent: Jan. 10, 2023

(54) WAVELENGTH CONVERSION DEVICE

(71) Applicant: Delta Electronics, Inc., Taoyuan (TW)

(72) Inventors: Jih-Chi Li, Taoyuan (TW); Li-Cheng Yang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 231 days.

(21) Appl. No.: 16/861,051

(22) Filed: Apr. 28, 2020

(65) Prior Publication Data

US 2021/0098662 A1    Apr. 1, 2021

(30) Foreign Application Priority Data

Sep. 30, 2019   (CN) .......................... 201910941353.4

(51) Int. Cl.
*H01L 33/50*   (2010.01)
*H01L 33/64*   (2010.01)
(Continued)

(52) U.S. Cl.
CPC ........ H01L 33/505 (2013.01); C09K 11/7774 (2013.01); F21K 9/64 (2016.08);
(Continued)

(58) Field of Classification Search
CPC ..... H01L 33/505; H01L 33/644; H01L 33/60; H01L 33/507; C09K 11/7774;
(Continued)

(56) References Cited

U.S. PATENT DOCUMENTS

| 8,203,161 B2 | 6/2012 | Simonian et al. |
| 9,431,586 B2 | 8/2016 | Eisert et al. |

(Continued)

FOREIGN PATENT DOCUMENTS

| CN | 204732443 U | 10/2015 |
| CN | 204879969 U | 12/2015 |

(Continued)

*Primary Examiner* — Anne M Hines
*Assistant Examiner* — Jose M Diaz
(74) *Attorney, Agent, or Firm* — Kirton McConkie; Evan R. Witt

(57) ABSTRACT

A wavelength conversion device includes a wavelength conversion plate, a reflective layer, a driving component and a thermal conductive layer. The wavelength conversion plate includes a lateral edge, at least one surface and a conversion region. The reflective layer is disposed on the surface of the wavelength conversion plate. The driving component is disposed near the lateral edge of the wavelength conversion plate and configured to displace the wavelength conversion plate. The thermal conductive layer is disposed on the surface of the wavelength conversion plate and thermally connected to the conversion region for conducting heat generated by the conversion region during a wavelength conversion. By disposing the thermal conductive layer on the surface of the wavelength conversion plate, the thermal conductive layer is thermally directly connected to the conversion region, so that the heat generated at the conversion region during the wavelength conversion is efficiently dissipated.

20 Claims, 12 Drawing Sheets

(51) Int. Cl.
  *G03B 21/20*   (2006.01)
  *F21K 9/64*    (2016.01)
  *G02B 26/00*   (2006.01)
  *C09K 11/77*   (2006.01)

(52) U.S. Cl.
  CPC ....... *G02B 26/008* (2013.01); *G03B 21/2066* (2013.01); *H01L 33/644* (2013.01)

(58) Field of Classification Search
  CPC ......... C09K 11/02; F21K 9/64; G02B 26/008; G03B 21/2066; G03B 21/16; G03B 21/204; G03B 21/14
  See application file for complete search history.

(56) References Cited

U.S. PATENT DOCUMENTS

| | | | |
|---|---|---|---|
| 9,519,207 | B2 | 12/2016 | Nakatsu et al. |
| 9,551,474 | B2 | 1/2017 | Nagao et al. |
| 9,891,511 | B2 | 2/2018 | Chang et al. |
| 10,288,872 | B2 | 5/2019 | Li et al. |
| 2012/0106126 | A1 | 5/2012 | Nojima et al. |
| 2013/0286359 | A1 | 10/2013 | Motoya et al. |
| 2016/0123557 | A1 | 5/2016 | Xu et al. |
| 2016/0238922 | A1 | 8/2016 | Furuyama et al. |
| 2016/0252722 | A1 | 9/2016 | Li et al. |
| 2017/0059979 | A1 | 3/2017 | Hsu et al. |
| 2018/0003363 | A1 | 1/2018 | Furuyama |
| 2019/0011817 | A1 | 1/2019 | Kobayashi et al. |
| 2019/0093871 | A1 | 3/2019 | Sato et al. |
| 2019/0121119 | A1 | 4/2019 | Chen et al. |
| 2020/0132261 | A1 | 4/2020 | Tsai et al. |
| 2020/0310236 | A1 | 10/2020 | Hsu et al. |
| 2021/0013384 | A1* | 1/2021 | Li ............................. F21V 9/30 |

FOREIGN PATENT DOCUMENTS

| | | |
|---|---|---|
| CN | 104713035 B | 6/2016 |
| CN | 106195925 A | 12/2016 |
| CN | 105135366 B | 4/2017 |
| CN | 107894689 A | 4/2018 |
| CN | 207689824 U | 8/2018 |
| CN | 106206904 B | 5/2019 |
| CN | 109863450 A | 6/2019 |
| CN | 208937894 U | 6/2019 |
| TW | M474264 U | 3/2014 |
| TW | 201531789 A | 8/2015 |
| TW | 201621452 A | 6/2016 |
| TW | 201701510 A | 1/2017 |
| TW | 201723627 A | 7/2017 |
| TW | M549365 U | 9/2017 |
| TW | I617059 B | 3/2018 |
| TW | I632323 B | 8/2018 |
| TW | 201906195 A | 2/2019 |

\* cited by examiner

WAVELENGTH CONVERSION DEVICE

FIELD OF THE INVENTION

The present disclosure relates to a wavelength conversion device, and more particularly to a wavelength conversion device to enhance thermal conductive efficiency.

BACKGROUND OF THE INVENTION

The wavelength conversion device utilizes for example a laser light source to excite a phosphor to obtain a predetermined monochromatic or polychromatic light, and has been widely applied in the fields of illumination sources, projection displays, and so on. Taking the projection display as an example, a laser light source is utilized to irradiate the phosphor wheel to produce the desired display color.

In the projection display application, the wavelength conversion device can be distinguished as a reflective type and a transmissive type. Taking the reflective wavelength conversion device as an example, the conventional reflective wavelength conversion device mainly includes a substrate, a reflective layer and a phosphor layer. The reflective layer is disposed between the substrate and the phosphor layer, and the phosphor layer is excited by the light source to generate predetermined monochromatic or polychromatic light. The generated monochromatic or polychromatic light is reflected by the reflective layer at the same time. When the phosphor layer is excited by the excitation light source, it is accompanied with heat generation. Furthermore, as the power of the excitation light is gradually increased, the amount of heat generated by the phosphor layer is also increased. However, a conventional reflective wavelength conversion device with the reflective layer disposed on one side of the substrate and a heat dissipation device disposed on an opposite side of the substrate for heat dissipation suffers a limitation that the effective area of heat dissipation is limited. Under the condition of high power excitation light, the heat generated by the phosphor layer being excited by the excitation light source cannot be dissipated in time. Consequently, the phosphor layer is performing the wavelength conversion at a high temperature and tends to deteriorate, thereby causing the light-emitting rate of the reflective wavelength conversion device to be sharply reduced. On the other hand, a transmissive wavelength conversion device has a transparent substrate and a phosphor layer, and heat dissipation is limited by the high thermal resistance between the phosphor layer and the transparent substrate. Under the condition of high power excitation light, it also suffers from poor dissipation of heat generated from the phosphor layer excited by the excitation light source. Similarly, the phosphor layer is performing wavelength conversion at a high temperature and tends to deteriorate.

Therefore, there is a need for providing a wavelength conversion device with enhanced thermal conductive efficiency and to address the above issues encountered by the prior arts.

SUMMARY OF THE INVENTION

In accordance with an aspect of the present disclosure, a wavelength conversion device is provided. The wavelength conversion device includes a wavelength conversion plate, a reflective layer, a driving component and a thermal conductive layer. The wavelength conversion plate includes a lateral edge, at least one surface and at least one conversion region. The at least one conversion region is configured to receive a light beam and convert a wavelength of the light beam. The reflective layer is disposed on the at least one surface of the wavelength conversion plate. The driving component is disposed proximal to the lateral edge of the wavelength conversion plate and configured to displace the wavelength conversion plate. The thermal conductive layer is disposed on the at least one surface of the wavelength conversion plate and directly connected to the at least one conversion region for conducting a heat generated at the at least one conversion region during a wavelength conversion.

In accordance with another aspect of the present disclosure, a wavelength conversion device is provided. The wavelength conversion device comprises a wavelength conversion plate, a reflective layer, a driving component and at least one thermal conductive layer. The wavelength conversion plate comprises a lateral edge, at least one surface and at least one conversion region. The at least one conversion region is configured to perform a wavelength conversion. The reflective layer is disposed on the at least one surface of the wavelength conversion plate. The driving component is disposed proximal to the lateral edge of the wavelength conversion plate and configured to displace the wavelength conversion plate. The at least one thermal conductive layer is disposed on the wavelength conversion plate and directly connected to the at least one conversion region for conducting a heat generated at the at least one conversion region during the wavelength conversion. The at least one surface includes a first surface and a second surface opposite to each other. The at least one thermal conductive layer includes a first thermal conductive layer and a second thermal conductive layer disposed on the first surface and the second surface, respectively.

In accordance with a further aspect of the present disclosure, a wavelength conversion device is provided. The wavelength conversion includes a wavelength conversion plate, a reflective layer, a driving component and a thermal conductive layer. The wavelength conversion plate comprises at least one surface and at least one conversion region adjacent to the at least one surface. Heat is generated when a light beam wavelength is converted at the at least one conversion region. The reflective layer is disposed on the at least one surface of the wavelength conversion plate. The driving component is connected to the wavelength conversion plate, and comprises a rotating shaft configured to displace the wavelength conversion plate. The thermal conductive layer is disposed on the at least one surface of the wavelength conversion plate and in thermal communication with the at least one conversion region for dissipating the heat. The thermal conductivity of the thermal conductive layer is greater than the thermal conductivity of the wavelength conversion plate. The thermal conductivity of the wavelength conversion plate is greater than the thermal conductivity of the reflective layer.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only, and is not intended to be exhaustive or to be limited to the precise form disclosed.

Figure 1:
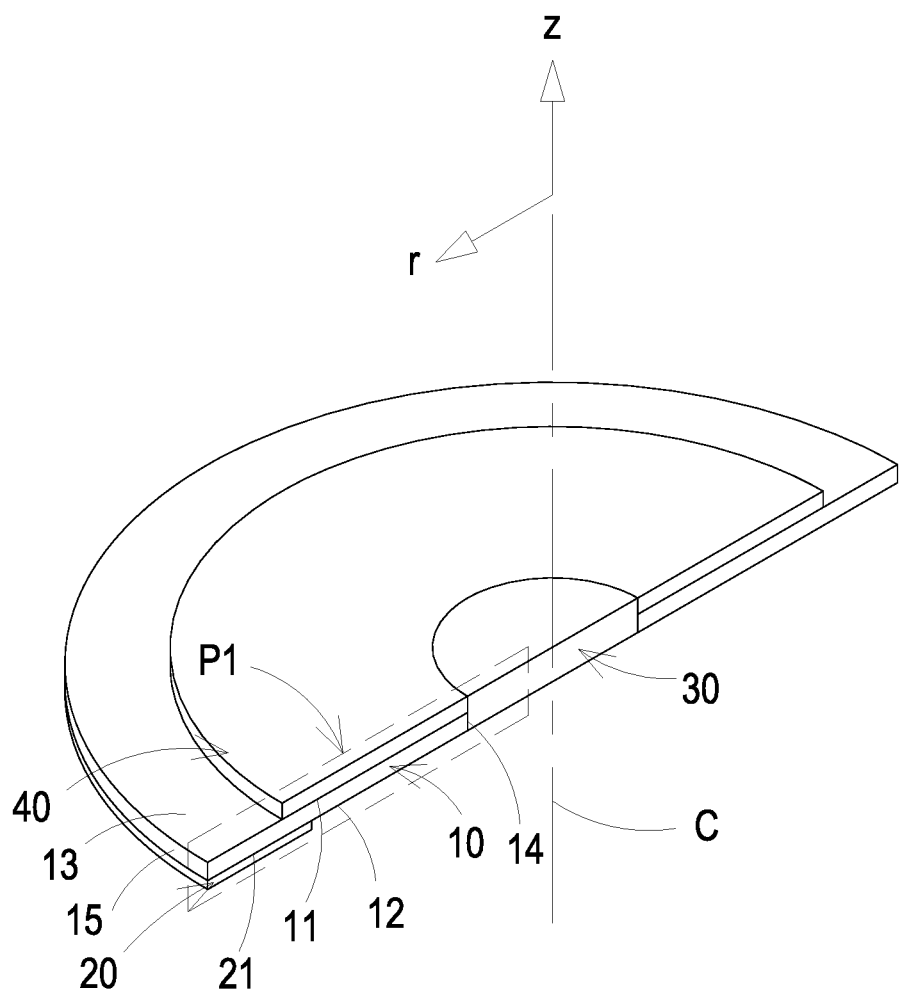
FIG. 1 is a cross-sectional structural view illustrating a wavelength conversion device according to a first embodiment of the present disclosure.
Figure 2:
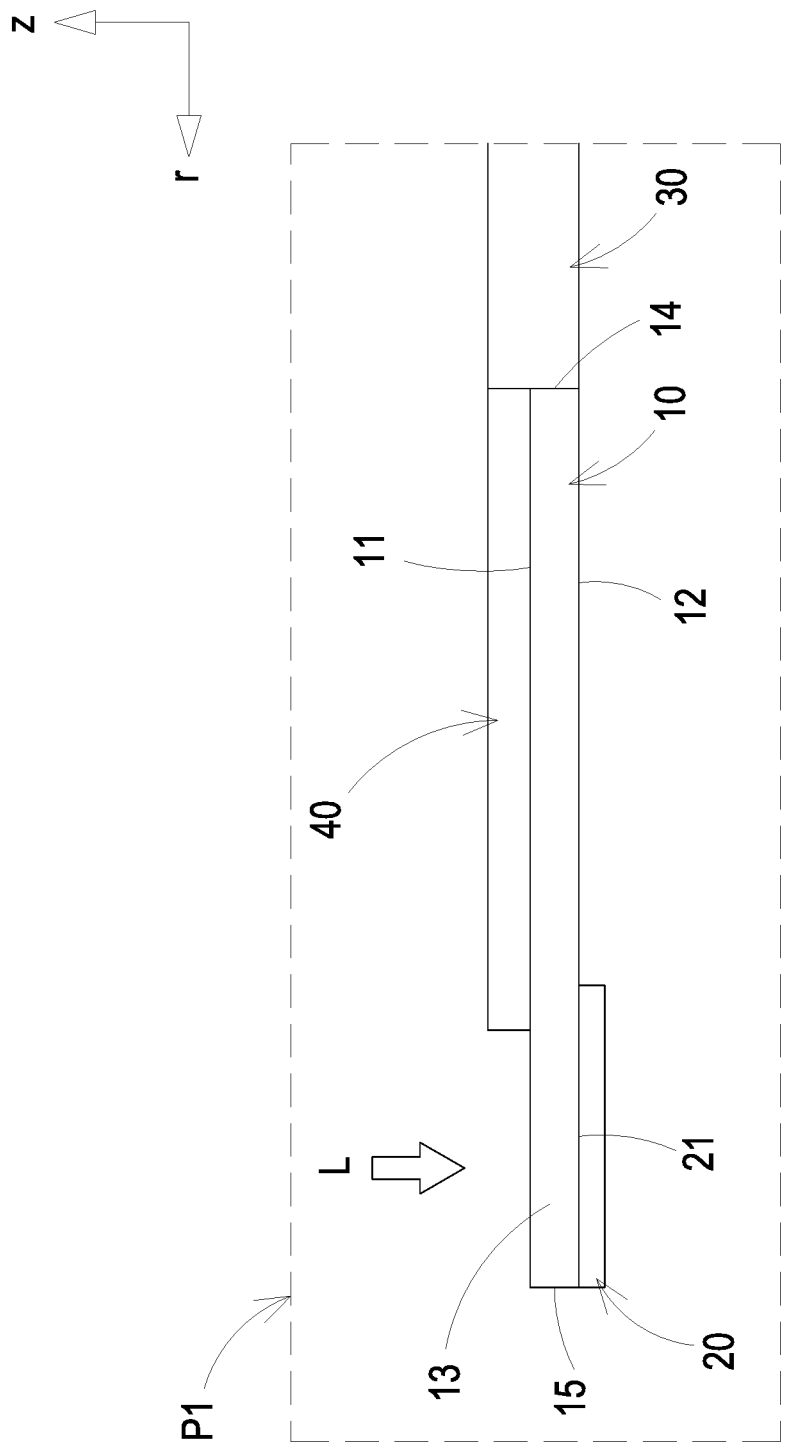
FIG. 2 is a cross-sectional view illustrating the region P1 of FIG. 1.
Figure 3:
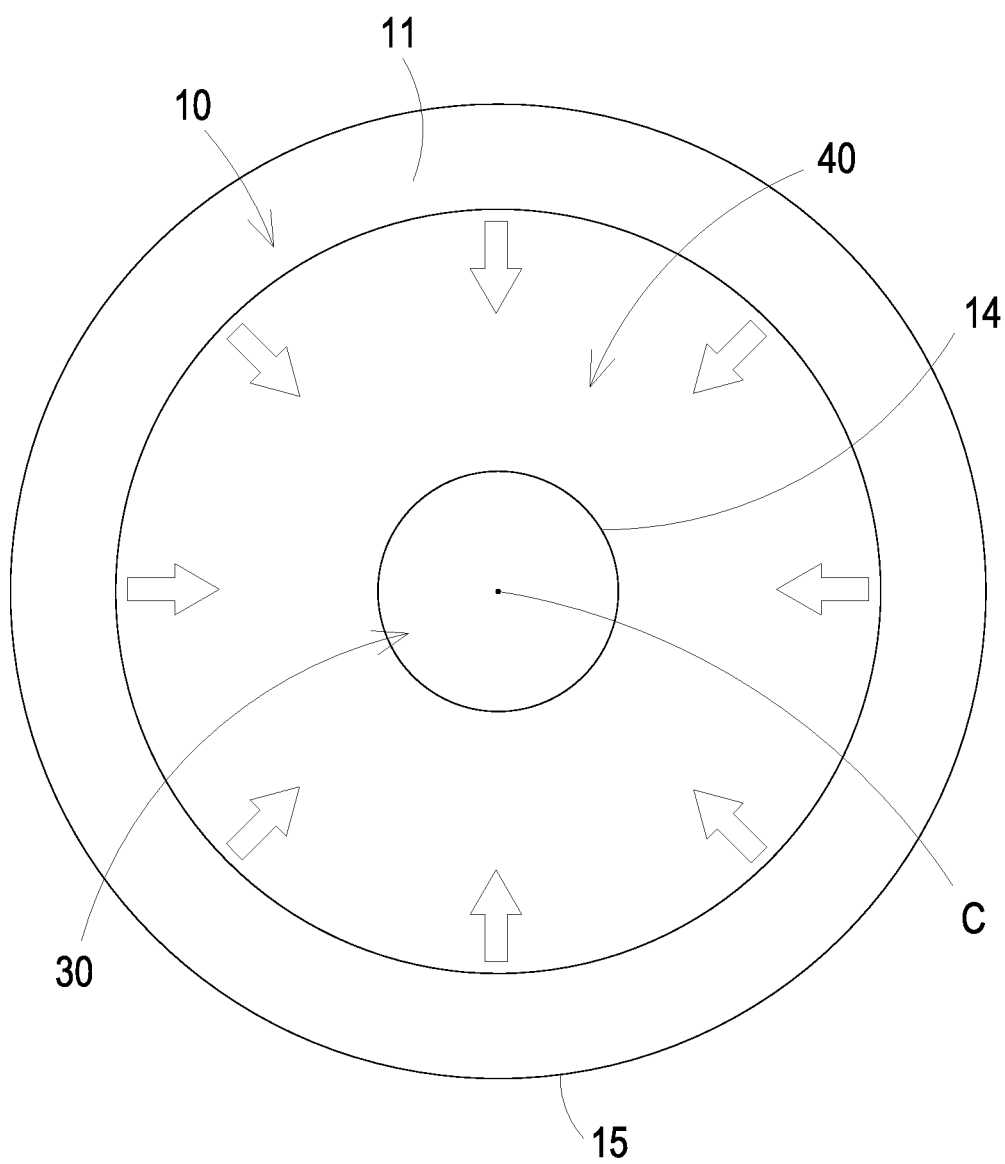
FIG. 3 is a top view illustrating the wavelength conversion device according to the first embodiment of the present disclosure.

Referring to FIGS. 1 to 3, the wavelength conversion device 1 includes a wavelength conversion plate 10, a reflective layer 20, a driving component 30 and a first thermal conductive layer 40. In the embodiment, the wavelength conversion device 1 is for example, but not limited to, a color wheel of a projector; the wavelength conversion plate 10 has for example, but not limited to, a disc shaped body; and the driving component 30 is for example, but not limited to, a motor shaft. The driving component 30 has a central rotating shaft C passing through the wavelength conversion plate 10 and is configured to rotate the wavelength conversion plate 10 about the central rotating shaft C. The wavelength conversion plate 10 and the driving component 30 may be connected to each other, for example, by an adhesive or a latching element. The wavelength conversion plate 10 includes a first surface 11, a second surface 12, at least one conversion region 13 and an inner lateral edge 14. Preferably but not exclusively, the wavelength conversion plate 10 has a thickness ranging from 0.7 mm to 1.5 mm. The first surface 11 and the second surface 12 are opposite to each other. The at least one conversion region 13 is located between the first surface 11 and the second surface 12. When the conversion region 13 is irradiated by an excitation light, such as a laser light L, a wavelength conversion is performed and heat is generated. In the embodiment, the inner lateral edge 14 is for example an inner edge of the disc body and a central perforation is defined by the inner lateral edge 14. Preferably but not exclusively, the reflective layer 20 is arranged in an annular shape and disposed on the second surface 12 of the wavelength conversion plate 10. The reflective layer 20 spatially corresponds to the at least one conversion region 13 of the wavelength conversion plate 10. Preferably but not exclusively, the reflective layer 20 has a thickness ranging from 70 μm to 150 μm. In the embodiment, the driving component 30 is disposed on the inner lateral edge 14 of the wavelength conversion plate 10, and the central rotating shaft C of the driving component 30 passes through the central perforation defined by the inner lateral edge 14. The driving component 30 is configured to displace the wavelength conversion plate 10. In the embodiment, the first thermal conductive layer 40 is disposed on the first surface 11 of the wavelength conversion plate 10 and directly connected to the at least one conversion region 13 of the wavelength conversion plate 10, so as to conduct the heat generated by the conversion region 13 during the wavelength conversion. Preferably but not exclusively, the first thermal conductive layer 40 has a thickness ranging from 350 μm to 400 μm. In the embodiment, the first thermal conductive layer 40 partially covers the first surface 11 of the wavelength conversion plate 10 and exposes the at least one conversion region 13. Shown in the figures, the at least one conversion region 13 is arranged in an annular shape and spatially corresponds to the reflective layer 20 disposed on the second surface 12 of the wavelength conversion plate 10. The at least one conversion region 13 and the reflective layer 20 are disposed near an outer lateral edge 15 of the wavelength conversion plate 10, such as the outer circumference of the disc body, and distal to the driving component 30. A surface of the reflective layer 20 in contact with the second surface 12 of the wavelength conversion plate 10 serves as a reflective surface 21.

Preferably but not exclusively, the thermal conductivity coefficient of the wavelength conversion plate 10 ranges from 0.5 W/mK to 10 W/mK. Preferably but not exclusively, the thermal conductivity coefficient of the reflective layer 20 ranges from 0.1 W/mK to 2 W/mK. Preferably but not exclusively, the thermal conductivity coefficient of the first thermal conductive layer 40 ranges from 30 W/mK to 5300 W/mK. In the embodiment, the thermal conductivity coefficient of the first thermal conductive layer 40 is greater than the thermal conductivity coefficient of the wavelength conversion plate 10 and also greater than the thermal conductivity coefficient of the reflective layer 20. The thermal conductivity coefficient of the wavelength conversion plate 10 is greater than the thermal conductivity coefficient of the reflective layer 20. In the embodiment, the first thermal conductive layer 40 partially covers the first surface 11 to expose the at least one conversion region 13 for receiving a beam of light. When the at least one conversion region 13 of the wavelength conversion plate 10 is irradiated by an excitation light, such as a laser light L, the heat generated during the wavelength conversion is preferentially conducted from the at least one conversion region 13 to the first thermal conductive layer 40 to be dissipated. With such direct heat transferring path, heat dissipation is not hindered by the reflective layer 20, which has a high thermal resistance. Effective heat dissipation also provides that the heat won't accumulate in the conversion region 13 to deteriorate the wavelength conversion efficiency. In the embodiment, a vertical projection of the first thermal conductive layer 40 on the wavelength conversion plate 10 and a vertical projection of the reflective layer 20 on the wavelength conversion plate 10 are at least partially overlapped, which reduces the thermal resistance effect of the reflective layer 20. Notably, when the wavelength conversion device 1 is applied to, for example, a color wheel of a projector, the heat generated from the at least one conversion region 13 of the wavelength conversion plate 10 during the wavelength conversion may be conducted not only in a vertical direction, for example in the axial direction (i.e. z axis direction), but also in the radial direction r toward the central rotating shaft C of the driving component 30, as shown in FIG. 3. In other words, the wavelength conversion device 1 of the present disclosure further provides the heat transferring path in the horizontal direction, so that the heat generated by the at least one conversion region 13 of the wavelength conversion plate 10 during the wavelength conversion may be dissipated more rapidly.

Figure 4:
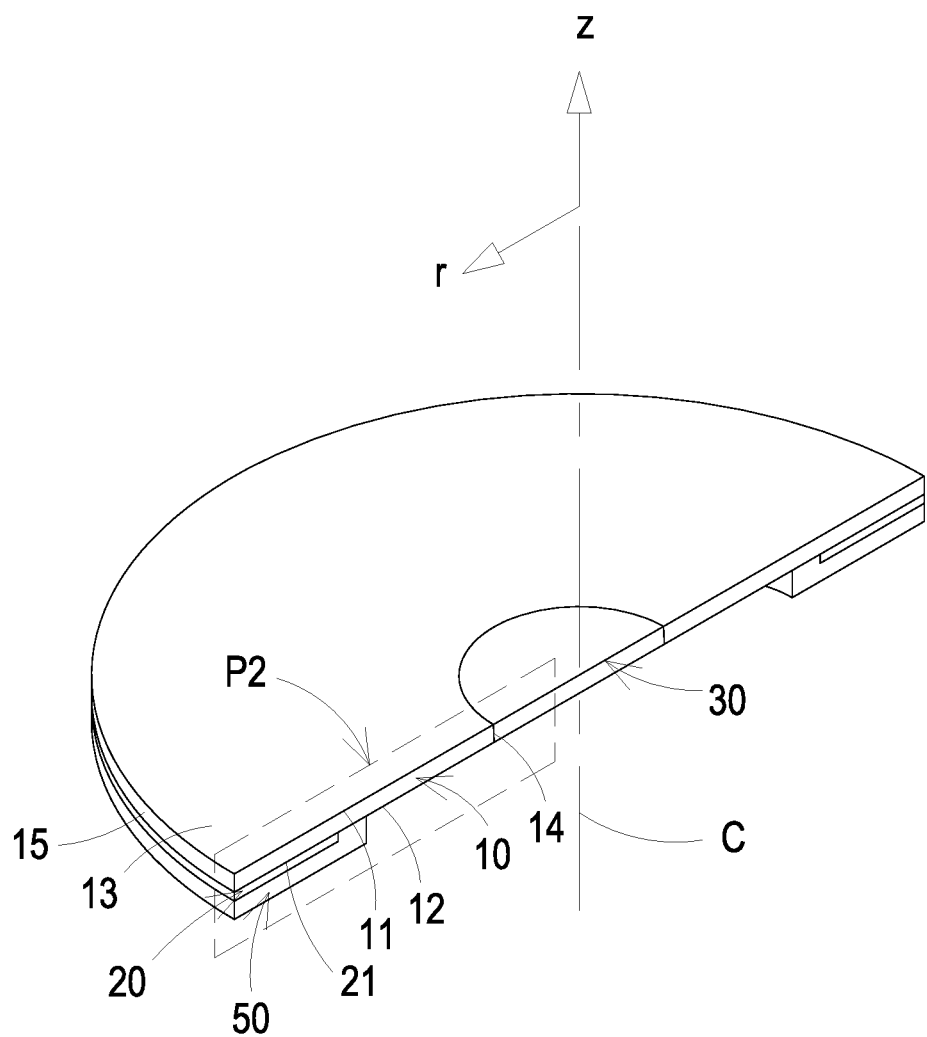
FIG. 4 is a cross-sectional structural view illustrating a wavelength conversion device according to a second embodiment of the present disclosure.
Figure 5:
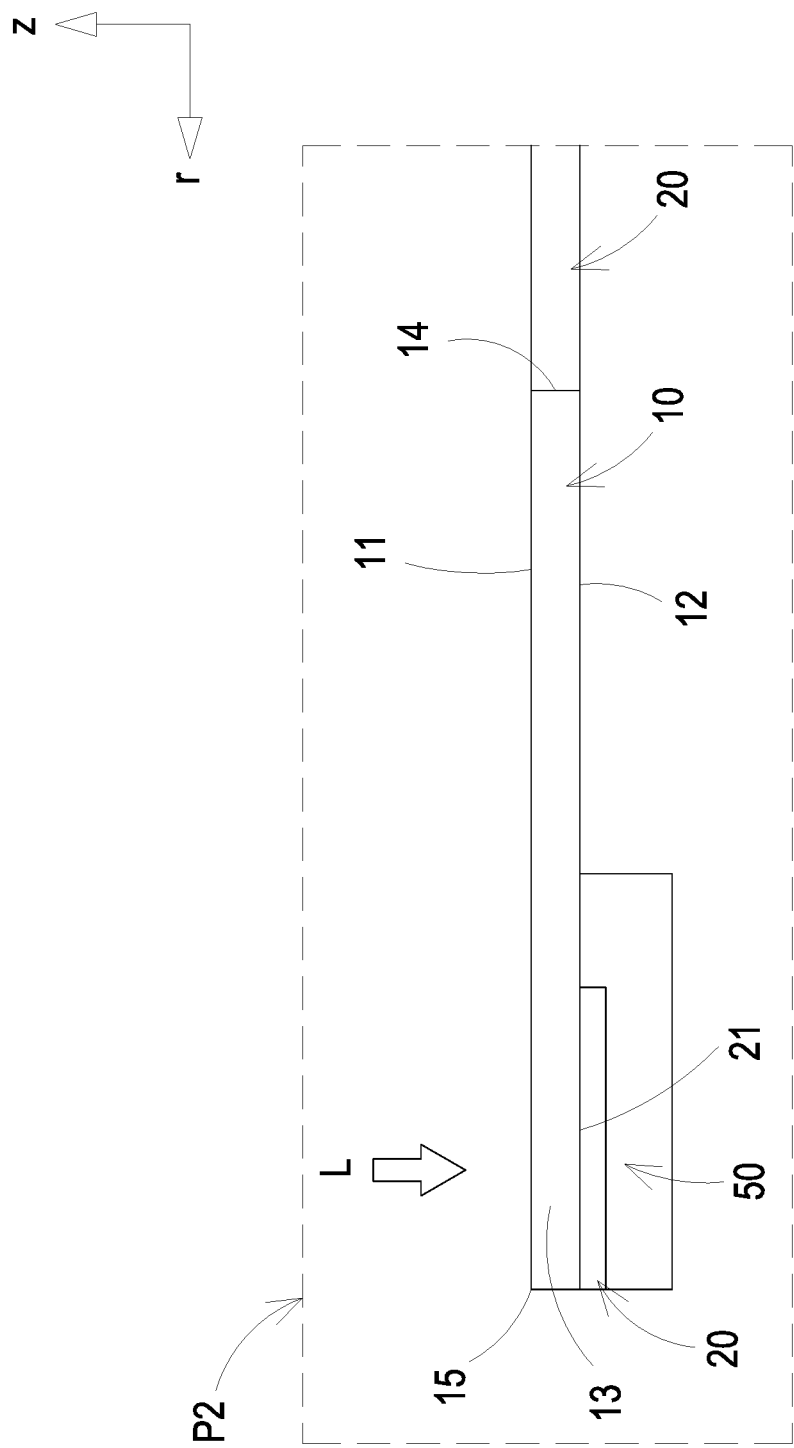
FIG. 5 is a cross-sectional view illustrating the region P2 of FIG. 4.

Referring to FIG. 4 and FIG. 5, in the embodiment, the structures, elements and functions of the wavelength conversion device 1a are similar to those of the wavelength conversion device 1 in FIG. 1, and the elements and features indicated by the numerals similar to those elements and features are not redundantly described herein. The wavelength conversion device 1a further includes a second thermal conductive layer 50 disposed on the second surface 12 of the wavelength conversion plate 10. The second thermal conductive layer 50 covers the reflective layer 20 and a part of the wavelength conversion plate 10, and is connected to the at least one conversion region 13. The second thermal conductive layer 50 is directly or indirectly connected to the at least one conversion region 13. Preferably but not exclusively, the thermal conductivity coefficient of the second thermal conductive layer 50 is ranges from 30 W/mK to 5300 W/mK. As can be seen, the vertical projection of the second thermal conductive layer 50 on the wavelength conversion plate 10 is greater than the vertical projection of the reflective layer 20 on the wavelength conversion plate 10, and the second surface 12 of the wavelength conversion plate 10 is directly in contact with the second thermal conductive layer 50. During the wavelength conversion, the heat generated from the conversion region 13 of the wavelength conversion plate 10 preferably dissipates via the second thermal conductive layer 50. Thus, the heat dissipation pathway of the wavelength conversion device 1a is not hindered by the reflective layer 20 which has a high thermal resistance, and reduces heat accumulation in the conversion region 13 which may deteriorate the wavelength conversion efficiency.

Figure 6:
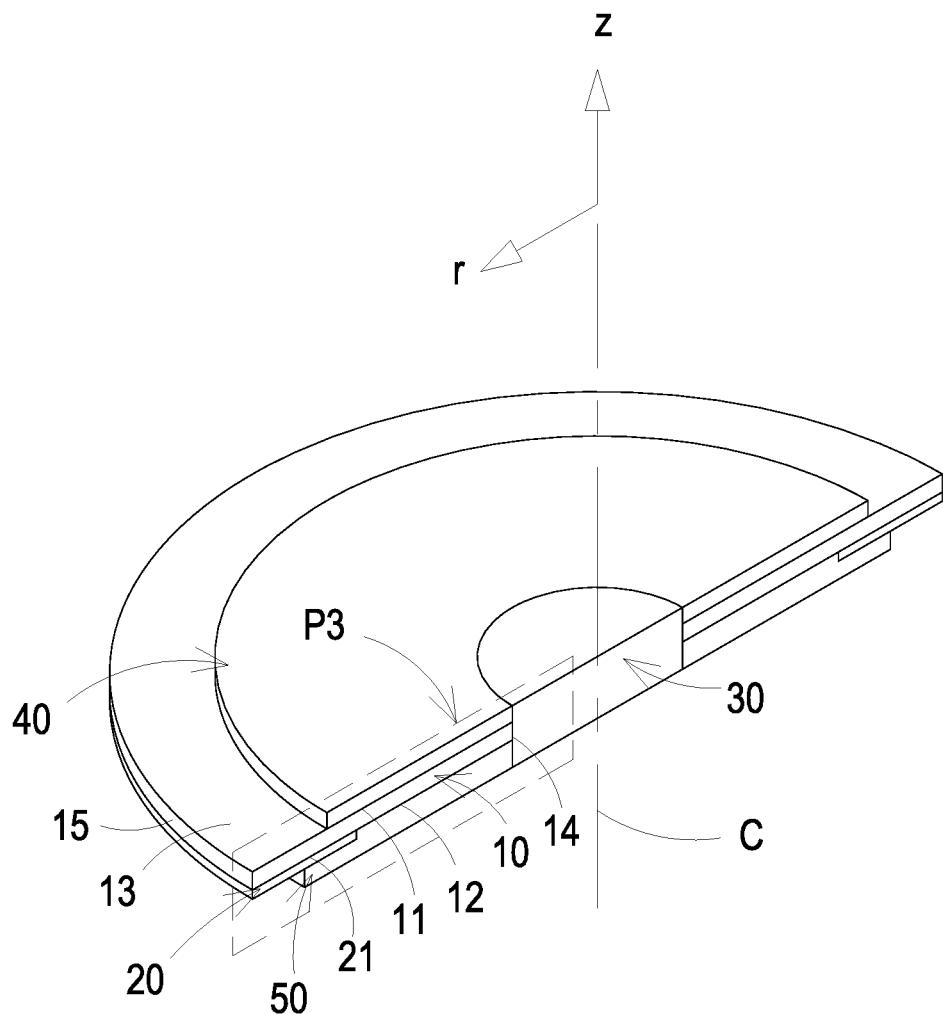
FIG. 6 is a cross-sectional structural view illustrating a wavelength conversion device according to a third embodiment of the present disclosure.
Figure 7:
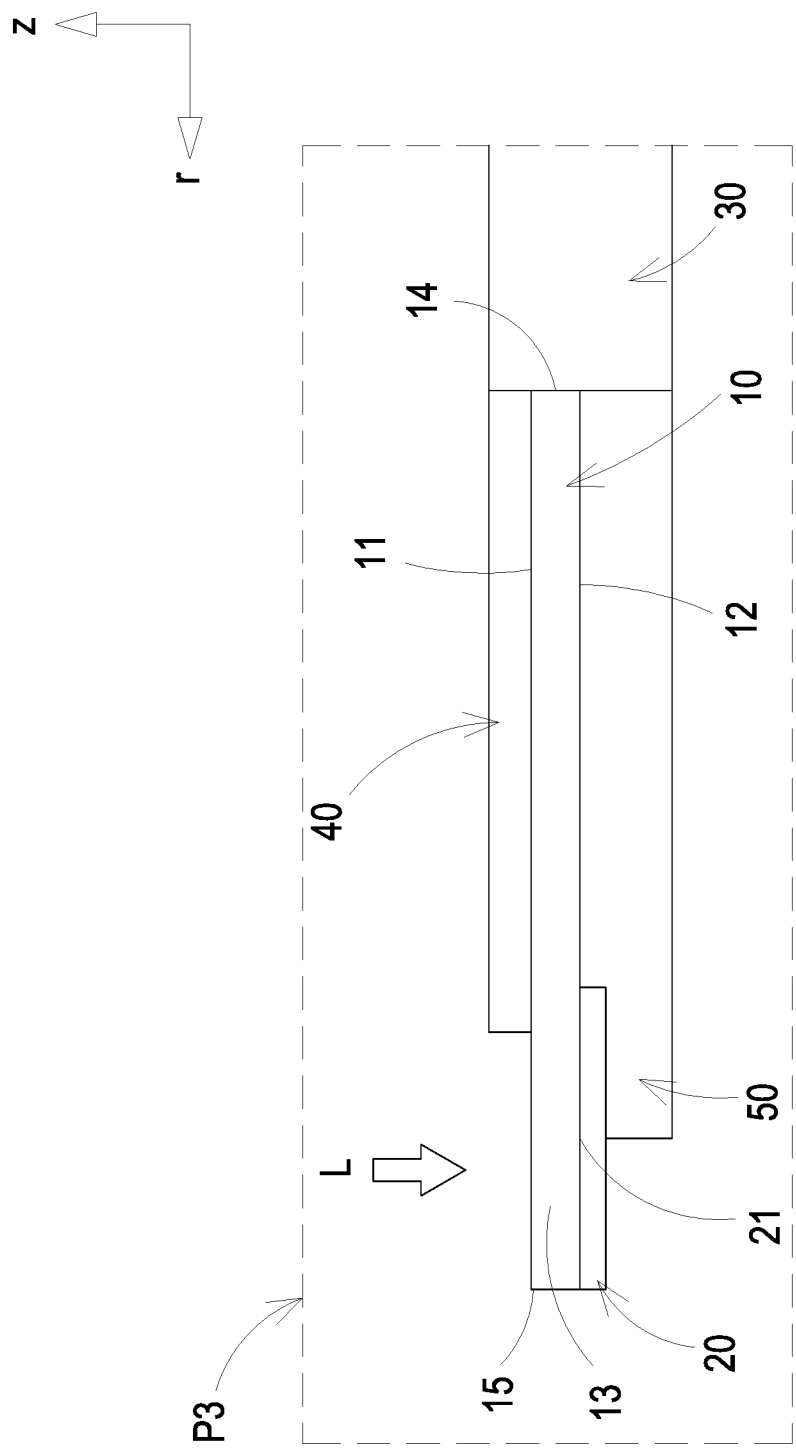
FIG. 7 is a cross-sectional view illustrating the region P3 of FIG. 6.

Referring to FIG. 6 and FIG. 7, in the embodiment, the structures, elements and functions of the wavelength conversion device 1b are similar to those of the wavelength conversion device 1 in FIG. 1, and the elements and features indicated by the numerals similar to those elements and features are not redundantly described herein. The wavelength conversion device 1b includes a first thermal conductive layer 40 and a second thermal conductive layer 50, which are disposed on the first surface 11 and the second surface 12 of the wavelength conversion plate 10, respectively. Moreover, the second thermal conductive layer 50 at least partially covers the reflective layer 20 and the wavelength conversion plate 10. Preferably but not exclusively, the thickness of the second thermal conductive layer 50 is greater than the thickness of the reflective layer 20. A vertical projection of the first thermal conductive layer 40 on the wavelength conversion plate 10 and a vertical projection of the second thermal conductive layer 50 on the wavelength conversion plate 10 are at least partially overlapped. Moreover, the first surface 11 and the second surface 12 of the wavelength conversion plate 10 are directly in contact with the first thermal conductive layer 40 and the second thermal conductive layer 50, respectively. During the wavelength conversion, the heat generated from the conversion region 13 of the wavelength conversion plate 10 preferably dissipates via the first thermal conductive layer 40 and the second thermal conductive layer 50. Thus, the heat dissipation pathways of the wavelength conversion device 1b reduce heat accumulation in the conversion region 13 which may deteriorate the wavelength conversion efficiency.

Figure 8:
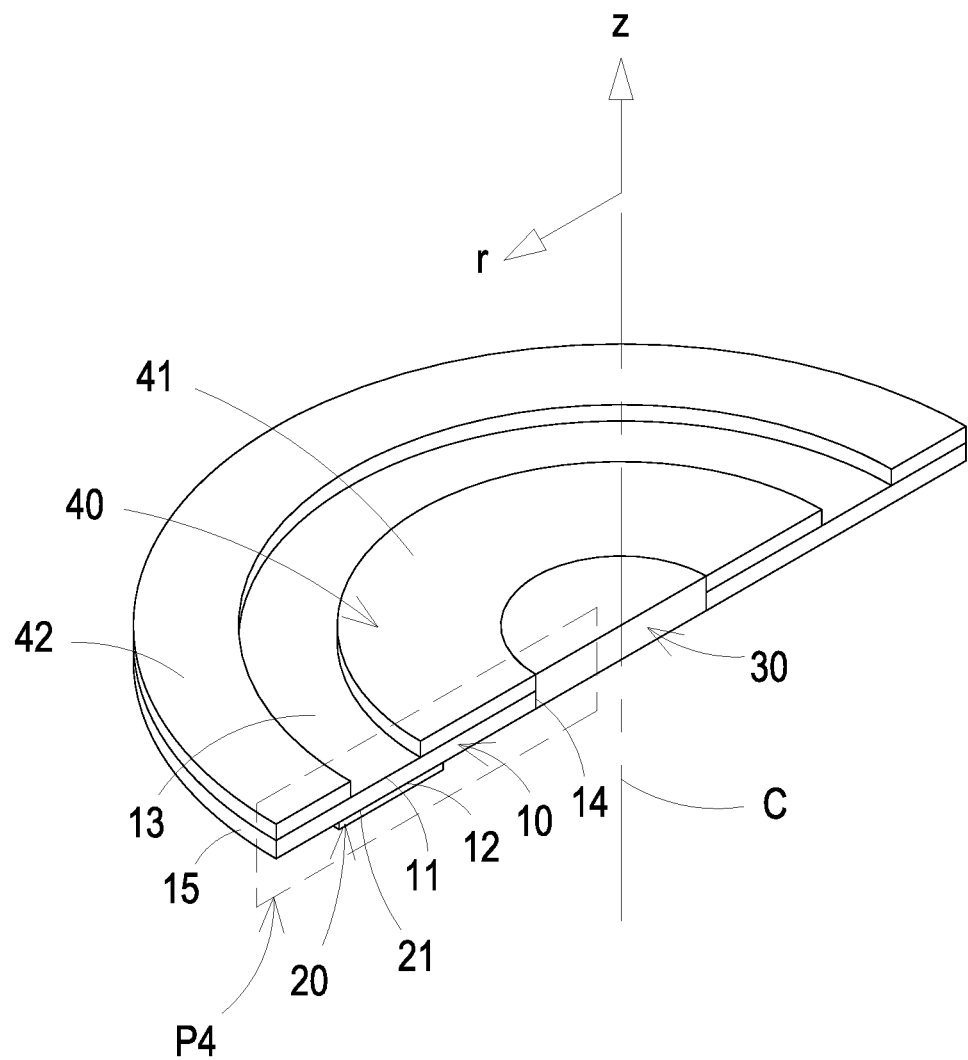
FIG. 8 is a cross-sectional structural view illustrating a wavelength conversion device according to a fourth embodiment of the present disclosure.
Figure 9:
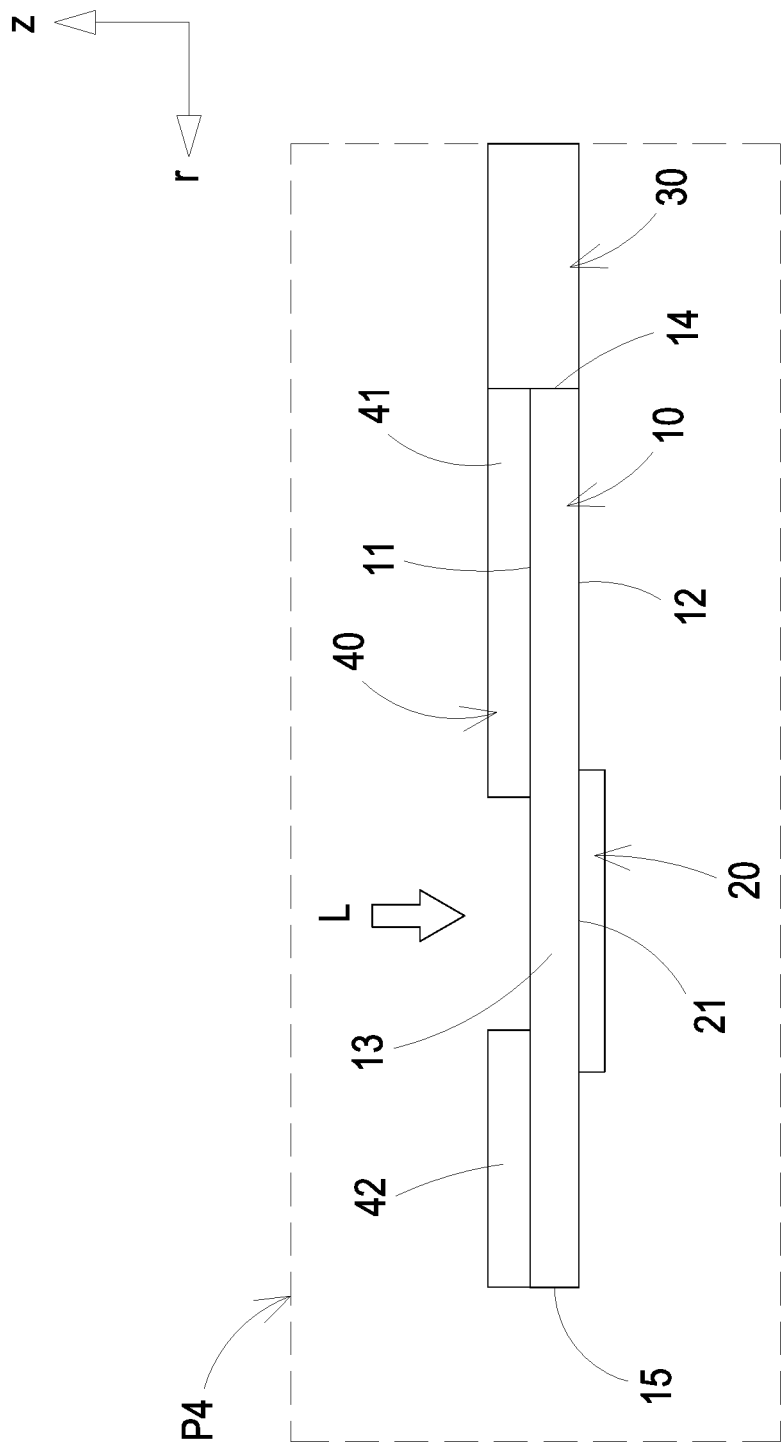
FIG. 9 is a cross-sectional view illustrating the region P4 of FIG. 8.
Figure 10:
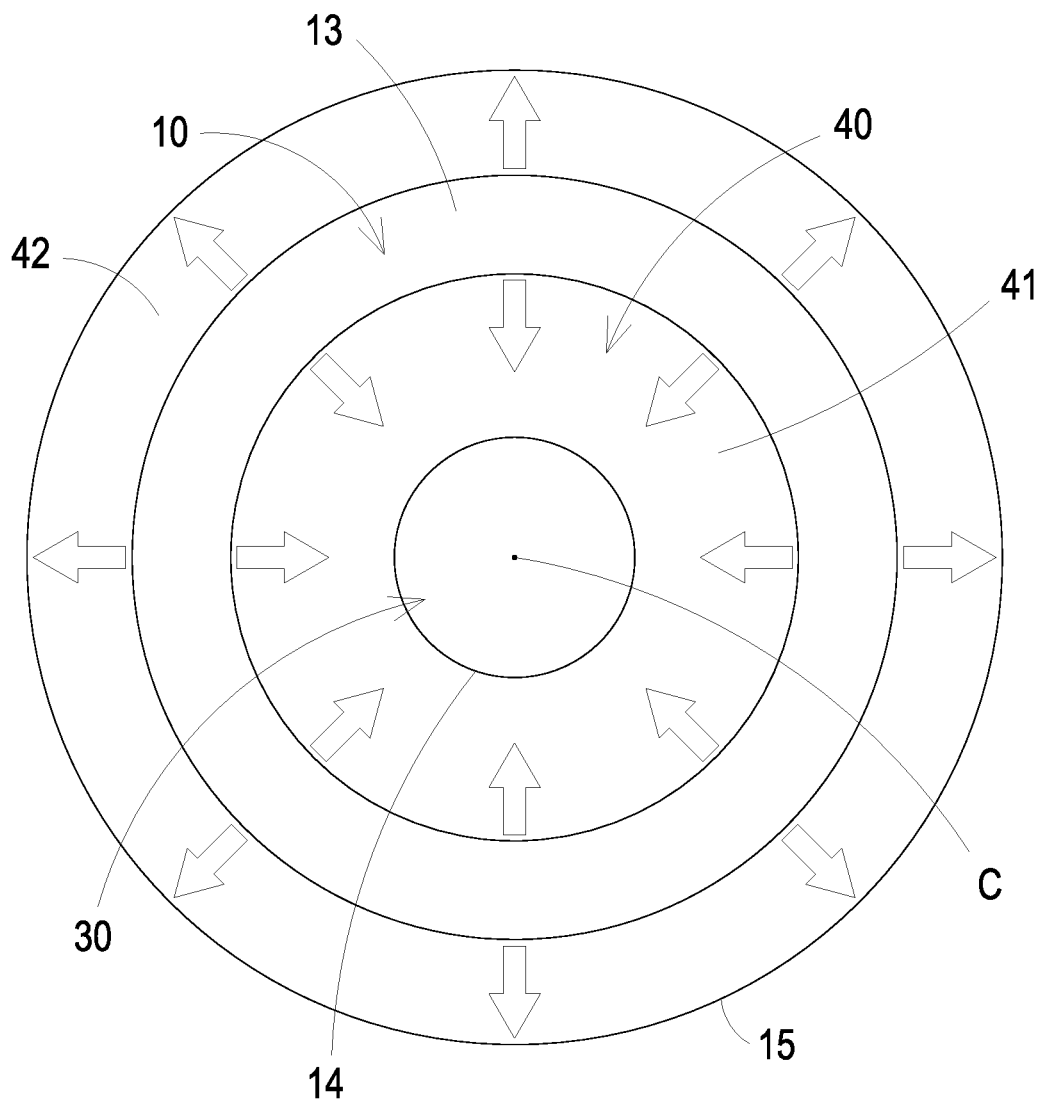
FIG. 10 is a top view illustrating the wavelength conversion device according to the fourth embodiment of the present disclosure.

Referring to FIGS. 8 to 10, in the embodiment, the structures, elements and functions of the wavelength conversion device 1c are similar to those of the wavelength conversion device 1 in FIG. 1, and the elements and features indicated by the numerals similar to those elements and features are not redundantly described herein. The first thermal conductive layer 40 of the wavelength conversion device 1c further includes a first thermal conductive region 41 and a second thermal conductive region 42, which are disposed near two opposite lateral edges (the inner lateral edge 14 and the outer lateral edge 15) of the at least one conversion region 13, respectively. The first thermal conductive region 41 and the second thermal conductive region 42 are connected to the at least one conversion region 13. During the wavelength conversion, the heat generated at the at least one conversion region 13 of the wavelength conversion plate 10 is conducted, for example in the horizontal direction towards two opposite lateral edges, such as the inner lateral edge 14 and the outer lateral edge 15 of the at least one conversion region 13. As an example, the wavelength conversion device 1c is applied to a color wheel of a projector and the conversion region 13 is disposed in an annular shape. During the wavelength conversion, the heat generated at the at least one conversion region 13 is conducted inwardly and outwardly in the radial direction r, as shown in FIG. 10. In other words, the wavelength conversion device 1c of the present disclosure further provides the heat transferring path in the horizontal direction, so that the heat generated at the at least one conversion region 13 of the wavelength conversion plate 10 during the wavelength conversion may be dissipated more rapidly and effectively. Heat accumulation in the conversion region 13 is reduced and less likely to cause deterioration of the wavelength conversion.

Figure 11:
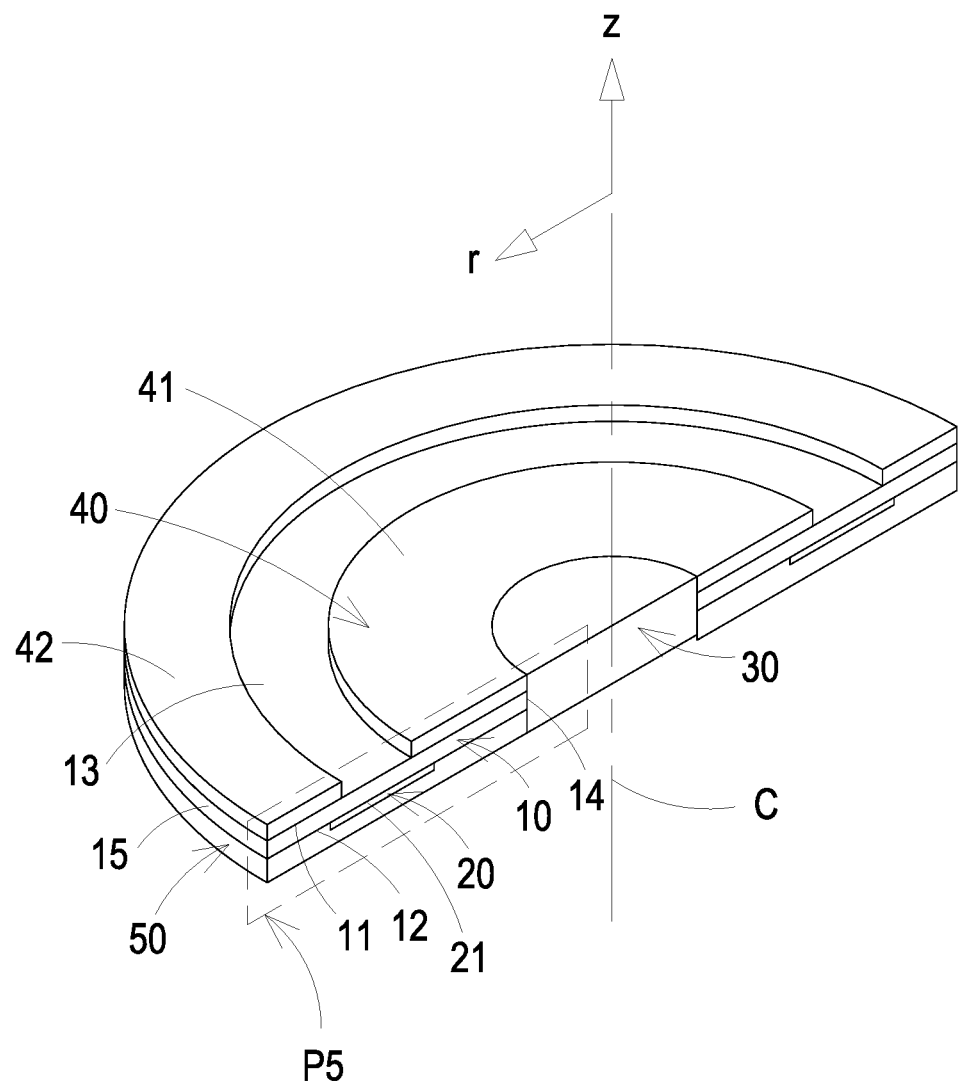
FIG. 11 is a cross-sectional structural view illustrating a wavelength conversion device according to a fifth embodiment of the present disclosure.
Figure 12:
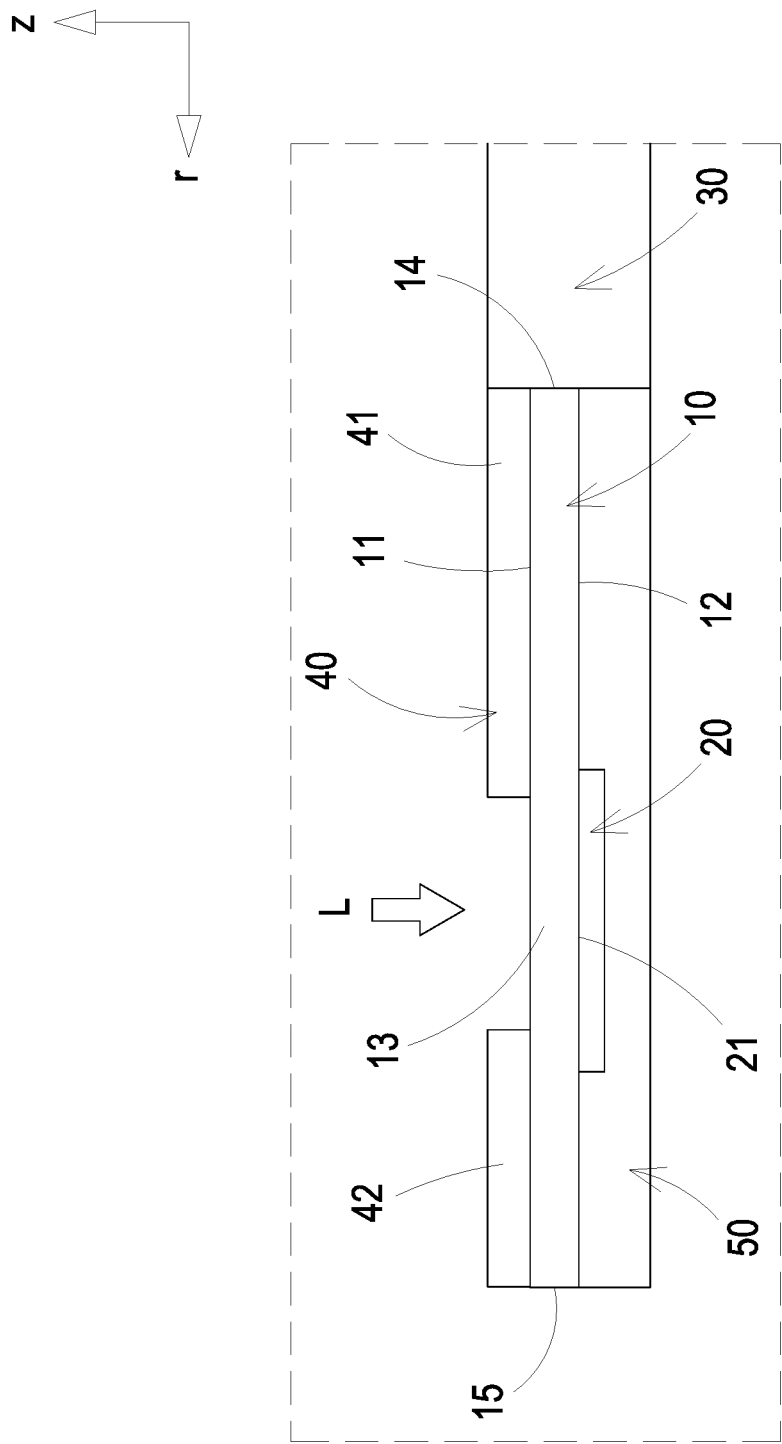
FIG. 12 is a cross-sectional view illustrating the region P5 of FIG. 11.

Referring to FIG. 11 and FIG. 12, in the embodiment, the structures, elements and functions of the wavelength conversion device 1d are similar to those of the wavelength conversion device 1c in FIG. 8 and the elements and features indicated by the numerals similar to those elements and features are not redundantly described herein. The wavelength conversion device 1d further includes a second thermal conductive layer 50 disposed on the second surface 12 of the wavelength conversion plate 10 and covering the reflective layer 20. Moreover, at least a part of the second thermal conductive layer 50 is directly in contact with the second surface 12 of the wavelength conversion plate 10. The heat generated at the at least one conversion region 13 during the wavelength conversion is also conducted, for example along a direction corresponding to the z axis. In other words, in addition to the heat transferring path in the horizontal direction (r axis), there is also enhanced heat transferring path in the vertical direction (z axis). In the embodiment, the thermal conductivity coefficient of the first thermal conductive layer 40 is greater than the thermal conductivity coefficient of the wavelength conversion plate 10 and the thermal conductivity coefficient of the reflective layer 20. The thermal conductivity coefficient of the second thermal conductive layer 50 is also greater than the thermal conductivity coefficient of the wavelength conversion plate 10 and the thermal conductivity coefficient of the reflective layer 20. The thermal conductivity coefficient of the wavelength conversion plate 10 is greater than the thermal conductivity coefficient of the reflective layer 20. Preferably but not exclusively, a vertical projection of the second thermal conductive layer 50 on the wavelength conversion plate 10 and a vertical projection of the first thermal conductive layer 40 on the wavelength conversion plate 10 are at least partially overlapped. In the embodiment, the thickness of the second thermal conductive layer 50 is greater than the thickness of the reflective layer 20, and the second thermal conductive layer 50 completely covers the second surface 12 of the wavelength conversion plate 10. Preferably but not exclusively, the thermal conductivity coefficient of the wavelength conversion plate 10 ranges from 0.5 W/mK to 10 W/mK. Preferably but not exclusively, the thermal conductivity coefficient of the reflective layer 20 ranges from 0.1 W/mK to 2 W/mK. Preferably but not exclusively, the thermal conductivity coefficient of the first thermal conductive layer 40 and the thermal conductivity coefficient of the second thermal conductive layer 50 each ranges from 30 W/mK to 5300 W/mK. In other words, the thermal conductivity coefficient of the first thermal conductive layer 40 and the thermal conductivity coefficient of the second thermal conductive layer 50 are both greater than the thermal conductivity coefficient of the wavelength conversion plate 10 and the thermal conductivity coefficient of the reflective layer 20. The thermal conductivity coefficient of the wavelength conversion plate 10 is greater than the thermal conductivity coefficient of the reflective layer 20. Thus, when the at least one conversion region 13 of the wavelength conversion plate 10 is irradiated by an excitation light, such as a laser light L, the heat generated during the wavelength conversion is preferably conducted from the at least one conversion region 13 to the first thermal conductive layer 40 to be dissipated. The generated heat is also conducted from the at least one conversion region 13 through the wavelength conversion plate 10 to the second thermal conductive layer 50 to be dissipated. With the arrangement of the wavelength conversion device 1d, the heat transferring path is less hindered by the reflective layer 20 which has a high thermal resistance, and further reduces heat accumulation in the conversion region 13 which may deteriorate the wavelength conversion efficiency.

The wavelength conversion plate 10 may be formed by sintering phosphor powder, wherein the phosphor powder is selected from aluminate, silicate or nitride for sintering at a high temperature. In other embodiments, the wavelength conversion plate 10 may be formed by sintering the phosphor powder, such as aluminate, silicate or nitride, and further mixing with a glass powder or an alumina power for sintering at a high temperature. Preferably but not exclusively, titanium dioxide ($TiO_2$) and silicon oxide polymer (Silicone) are mixed and degassed for coating on the second surface 12 of the wavelength conversion plate 10, and further curing for example at 200° C., to form the reflective layer 20. The present disclosure is not limited thereto and in other embodiment, the reflective layer 20 is formed, for example, by high temperature sintering of titanium dioxide mixed with a glass powder or titanium dioxide mixed with an alumina powder.

The thermal conductive layer of the present disclosure may be made of a thermal conductive material which includes at least one selected from the group comprising of silver, copper, diamond powder, graphene and other high thermal conductive material, and may be further mixed with a binder. Preferably but not exclusively, the thermal conductive layers are disposed on the first surface 11 and the second surface 12 of the wavelength conversion plate 10 by a coating process, not limited to wet coating of mixed powder or direct sputtering of a target. Preferably but not exclusively, the wavelength conversion plate 10 is formed by sintering yttrium aluminum garnet (YAG) mixed with a glass powder or an alumina powder at a high temperature. For example, using a silver paste, the thermal conductive layers are disposed on the surfaces of the wavelength conversion plate by a wet coating process, and then curing for example at 200° C. Preferably, the silver paste is made of silver powder mixed with silicone polymer. Preferably, the silver powder has a particle diameter ranging from 0.5 μm to 5 μm. The particles of silver powder may be in a spherical shape or a flake shape. The silver powder contained in the silver paste may range from 60 wt. % to 90 wt. %. In other embodiments, the silicon polymer may be replaced by an epoxy resin or an organic mixture containing a glass powder.

Table 1 shows the pumping test results of a wavelength conversion device without the first thermal conductive layer 40 and the second thermal conductive layer 50, compared with a wavelength conversion device 1d embodiment shown in FIG. 11 and FIG. 12.

|  | Surface temperature, 16.8 W Pumping, Static state (IR measurement, ° C.) | Brightness, 160 W Pumping, Dynamic state, 7200 rpm | Surface temperature, 160 W Pumping, Dynamic state, 7200 rpm (IR measurement, ° C.) |
| --- | --- | --- | --- |
| Comparative example | 84.3 | 100% | 116~118 |
| First example | 67.6 | 102% | 105~108 |

As shown in Table 1, the wavelength conversion device 1d has a lower surface temperature under 16.8 W pumping in static state. Moreover, under 160 W pumping in 7200 rpm dynamic state, the wavelength conversion device 1d has a lower surface temperature, and the wavelength conversion efficiency (represented by Brightness) has not deteriorated. Compared with the comparative example which does not have the first thermal conductive layer 40 and the second thermal conductive layer 50, the wavelength conversion device 1d has better heat dissipation. That is, the surface temperature of the conversion region 13 of the wavelength conversion device 1d is reduced more effectively.

Table 2 shows the pumping test results of another comparative example, comparing heat dissipation effectiveness of another example of the wavelength conversion device 1d (Second example).

|  | Surface temperature, 16.8 W Pumping, Static state (IR measurement, ° C.) | Brightness, 160 W Pumping, Dynamic state, 7200 rpm | Surface temperature, 160 W Pumping, Dynamic state, 7200 rpm (IR measurement, ° C.) |
| --- | --- | --- | --- |
| Comparative example | 84.3 | 100% | 116~118 |
| Second example | 55.3 | 103% | 102~105 |

In the second example, the wavelength conversion plate 10 is formed by sintering yttrium aluminum garnet (YAG) mixed with a glass powder at a high temperature. Reflective layer 20 is formed on the second surface 12 of the wavelength conversion plate 10 using titanium dioxide ($TiO_2$) mixed with a glass powder, cellulose and mono-butyl ether for coating, degassing, drying and high-temperature sintering. The first thermal conductive layer 40 and the second thermal conductive layer 50 are silver paste, and are disposed on the first surface 11 and the second surface 12 of the wavelength conversion plate 10 by a coating process. Then, drying and high-temperature sintering are performed to obtain the Second example of the wavelength conversion device 1d.

As shown in Table 2, the Second example of the wavelength conversion device 1d has a lower surface temperature under 16.8 W pumping in static state. Moreover, under 160 W pumping in 7200 rpm dynamic state, the Second example of the wavelength conversion device 1d has a lower surface temperature, and the wavelength conversion efficiency has not deteriorated. Compared with the comparative example which does not have the first thermal conductive layer 40 and the second thermal conductive layer 50, the Second example of the wavelength conversion device 1d has better heat dissipation and the surface temperature of the conversion region 13 of the wavelength conversion device 1d is reduced more effectively.

In summary, the present disclosure provides a wavelength conversion device, applicable to a color wheel of a projector. By disposing the thermal conductive layer adjacent to at least one surface of the wavelength conversion plate, the thermal conductive layer can be directly connected to the conversion region. Thus, the heat generated from the conversion region during wavelength conversion can be more effectively dissipated. The configuration of the present disclosure reduces the effect by the heat transferring path being hindered by the reflective layer, which has high thermal resistance, found in conventional devices. Lowering heat being accumulated in the conversion region reduces deterioration of the wavelength conversion efficiency. Furthermore, a conversion region (exposed for receiving a light beam) on the wavelength conversion plate being defined by the surrounding thermal conductive layer disposed on the surface of the wavelength conversion plate, provides for the direct contact area of the thermal conductive layer and the wavelength conversion plate to be potentially maximized for better heat dissipation. As previously described, the thermal conductivity coefficient of the thermal conductive layer is greater than the thermal conductivity coefficient of the wavelength conversion plate, so the heat generated from the conversion region during the wavelength conversion can directly conduct from the wavelength conversion plate to the thermal conductive layer which has a high thermal conductivity. By increasing and maximizing the thermal conductive area between the thermal conductive layer and the wavelength conversion plate, heat dissipation efficiency may be enhanced. Furthermore, providing the thermal conductive layers disposed on two opposite sides of the wavelength conversion plate further increases the thermal conductive area contact between the wavelength conversion plate and the thermal conductive layers. Moreover, the present disclosure provides improved heat dissipation over the prior art by reducing the hindrance caused by the thermal resistance effect of the reflective layer which has a low thermal conductivity coefficient.

While the disclosure has been described in terms of what is presently considered to be the most practical and preferred embodiments, it is to be understood that the disclosure needs not be limited to the disclosed embodiment, and is intended to cover various modifications and similar arrangements included within the scope of the appended claims and encompass all such modifications and similar structures.

What is claimed is:

1. A wavelength conversion device comprising:
   a wavelength conversion plate comprising a lateral edge, at least one surface and at least one conversion region, wherein the at least one conversion region is configured to receive a light beam and convert a wavelength of the light beam;
   a reflective layer disposed on the at least one surface of the wavelength conversion plate;
   a driving component disposed proximal to the lateral edge of the wavelength conversion plate and configured to displace the wavelength conversion plate; and
   a thermal conductive layer disposed on the at least one surface of the wavelength conversion plate and directly connected to the at least one conversion region for conducting a heat generated at the at least one conversion region during a wavelength conversion, wherein a thermal conductivity coefficient of the thermal conductive layer is greater than a thermal conductivity coefficient of the wavelength conversion plate.

2. The wavelength conversion device according to claim 1, wherein the thermal conductive layer partially covers the wavelength conversion plate and exposes the at least one conversion region for receiving the light beam and converting the wavelength of the light beam.

3. The wavelength conversion device according to claim 1, wherein the thermal conductivity coefficient of the wavelength conversion plate is greater than a thermal conductivity coefficient of the reflective layer.

4. The wavelength conversion device according to claim 1, wherein the thermal conductive layer is disposed on the at least one surface of the wavelength conversion plate by a coating process.

5. The wavelength conversion device according to claim 1, wherein the wavelength conversion device is a color wheel, and the reflective layer and the at least one conversion region are disposed in an annular shape, and wherein the driving component comprises a rotating shaft and is configured to rotate the wavelength conversion plate about the rotating shaft.

6. The wavelength conversion device according to claim 1, wherein the thermal conductive layer comprises a thermal conductive material comprising at least one selected from a group comprising of: silver, copper, diamond powder and graphene.

7. The wavelength conversion device according to claim 2, wherein the thermal conductive layer comprises a first thermal conductive region and a second thermal conductive region, wherein the first thermal conductive region and the second thermal conductive region are disposed adjacent to two opposite lateral edges of the at least one conversion region, respectively, to partially cover the wavelength conversion plate and expose the at least one conversion region.

8. The wavelength conversion device according to claim 1, wherein the wavelength conversion plate is formed by: sintering a phosphor powder selected from a group comprising of aluminate, silicate and nitride; or sintering the phosphor powder mixed with a glass powder or an alumina powder.

9. The wavelength conversion device according to claim 1, wherein the reflective layer is formed by: curing of titanium dioxide mixed with silicon oxide polymer; or sintering of titanium dioxide mixed with a glass powder or an alumina powder.

10. A wavelength conversion device comprising:
    a wavelength conversion plate comprising a lateral edge, at least one surface and at least one conversion region, wherein the at least one conversion region is configured to perform a wavelength conversion;
    a reflective layer disposed on the at least one surface of the wavelength conversion plate;

a driving component disposed proximal to the lateral edge of the wavelength conversion plate and configured to displace the wavelength conversion plate; and at least one thermal conductive layer disposed on the wavelength conversion plate and directly connected to the at least one conversion region for conducting a heat generated at the at least one conversion region during the wavelength conversion, wherein the at least one surface comprises a first surface and a second surface opposite to each other, and wherein the at least one thermal conductive layer comprises a first thermal conductive layer and a second thermal conductive layer disposed on the first surface and the second surface, respectively.

11. The wavelength conversion device according to claim 10, wherein the thermal conductive layer partially covers the first surface and exposes the at least one conversion region for receiving a beam of light.

12. The wavelength conversion device according to claim 10, wherein the reflective layer is disposed on the second surface, and the second thermal conductive layer partially covers the reflective layer, and wherein a thickness of the second thermal conductive layer is greater than a thickness of the reflective layer.

13. The wavelength conversion device according to claim 10, wherein a vertical projection of the first thermal conductive layer on the wavelength conversion plate and a vertical projection of the second thermal conductive layer on the wavelength conversion plate are at least partially overlapped.

14. The wavelength conversion device according to claim 10, wherein the wavelength conversion device is a color wheel, and the at least one conversion region and the reflective layer are disposed in an annular shape, and wherein the driving component comprises a rotating shaft configured to rotate the wavelength conversion plate about the rotating shaft.

15. The wavelength conversion device according to claim 10, wherein the wavelength conversion plate is formed by: sintering a phosphor powder selected from a group comprising of aluminate, silicate and nitride; or sintering the phosphor powder mixed with a glass powder or an alumina powder.

16. The wavelength conversion device according to claim 10, wherein the reflective layer is formed by: curing of titanium dioxide with silicon oxide polymer; or sintering of titanium dioxide mixed with a glass powder or an alumina powder.

17. A wavelength conversion device comprising:

a wavelength conversion plate comprising at least one surface and at least one conversion region adjacent to the at least one surface, wherein a heat is generated when a light beam wavelength is converted at the at least one conversion region;

a reflective layer disposed on the at least one surface of the wavelength conversion plate;

a driving component connected to the wavelength conversion plate, the driving component comprising a rotating shaft configured to displace the wavelength conversion plate; and a thermal conductive layer disposed on the at least one surface of the wavelength conversion plate and in thermal communication with the at least one conversion region for dissipating the heat, wherein a thermal conductivity of the thermal conductive layer is greater than a thermal conductivity of the wavelength conversion plate, and wherein the thermal conductivity of the wavelength conversion plate is greater than a thermal conductivity of the reflective layer.

18. The wavelength conversion device according to claim 17, wherein the wavelength conversion plate comprises a disc shape with a central perforation and an outer lateral edge, wherein the rotating shaft is disposed through the central perforation, and wherein the at least one conversion region and the reflective layer are arranged in an annular configuration proximal to the outer lateral edge.

19. The wavelength conversion device according to claim 17, wherein the wavelength conversion plate is formed by: sintering a phosphor powder selected from a group comprising of aluminate, silicate and nitride for sintering; or sintering the phosphor powder mixed with a glass powder or an alumina powder.

20. The wavelength conversion device according to claim 17, wherein the reflective layer is formed by: curing of titanium dioxide mixed with silicon oxide polymer; or sintering of titanium dioxide mixed with a glass powder or an alumina powder.

* * * * *